United States Patent [19]

Kitts

[11] Patent Number: 4,633,167

[45] Date of Patent: Dec. 30, 1986

[54] TESTER FOR ELECTRICAL JOY STICK CONTROLLERS

[76] Inventor: Melvin M. Kitts, 5870 Ziegler, Taylor, Mich. 48180

[21] Appl. No.: 574,893

[22] Filed: Jan. 30, 1984

[51] Int. Cl.$^4$ .............................................. G01R 31/02
[52] U.S. Cl. ...................................... 324/51; 340/709; 273/148 B; 273/DIG. 28
[58] Field of Search ...................... 324/51, 52, 66, 415, 324/418, 133; 307/112, 113, 115, 147; 273/148 B, DIG. 28; 340/644, 651, 709, 55, 686, 706; 74/471 XY; 200/52 R

[56] References Cited

U.S. PATENT DOCUMENTS

| | | |
|---|---|---|
| 3,417,324 | 12/1968 | Bredeneyer . |
| 3,599,199 | 8/1971 | Bunting ................. 340/286 |
| 3,663,939 | 5/1972 | Olsson ................. 324/51 X |
| 3,728,616 | 4/1973 | Cheek et al. ............ 324/51 |
| 3,831,089 | 8/1974 | Pearce ................. 324/122 |
| 3,931,574 | 1/1976 | Curtis, Jr. et al. ..... 324/158 F |
| 4,166,242 | 8/1979 | Spiteri ............. 324/133 X |
| 4,382,166 | 5/1983 | Kim ................. 273/148 B X |

*Primary Examiner*—Reinhard J. Eisenzopf
*Assistant Examiner*—Jack B. Harvey
*Attorney, Agent, or Firm*—Cullen, Sloman, Cantor, Grauer, Scott, & Rutherford

[57] ABSTRACT

Apparatus is provided for testing the continuity and possible short circuit of a plurality of electrical switches and an associated multi-lead connecting cable of a conventional joy stick controller used for video games and the like. The apparatus includes a module provided with a power supply and a connector for receiving the control cable. A plurality of indicator lamps are connected in circuits with the joy stick switches and are spatially arranged on the module to correspond to a position of the joy stick which results in activation of the associated switch. The lamps indicate the continuity or short circuit of the switches as well as the associated leads of the connecting cable. Additional indicating lamps are provided on the module to indicate the continuity of other control switches on the controller which are operated independently of the joy stick.

13 Claims, 6 Drawing Figures

TESTER FOR ELECTRICAL JOY STICK CONTROLLERS

DESCRIPTION

1. Technical Field

The present invention broadly relates to electrical test apparatus and deals more particularly with a device for detecting short circuits and checking the electrical continuity of an electrical joy stick controller.

2. Background Art

The information a computer receives for processing can come from many sources: magnetic discs, magnetic tapes, typewriter-style keyboards, numeric keypads, modems, even sophisticated, voice activated input systems. Typically, to play games with a computer, the information is communicated with a mechanical controller having multiple degrees of freedom of movement and popularly known as a paddle, a joy stick, or a track ball.

Joy sticks are by far the most popular game controllers; it has been estimated that approximately 70 percent of the action-style video and computer games currently available are being designed to be played with joy sticks. Joy sticks typically have two control elements—a stick and a trigger button. Using the stick, a player can move a cursor in at least eight different directions—up, down, left, right, or along either diagonal. The trigger button is employed to activate a special event in the game, such as the firing of a missile.

A typical switch-type joy stick has four microswitch pads spaced 90 degrees apart in its base. When a player pushes the stick in a given direction, the part that extends into the base closes a contact—or two contacts if the motion is diagonal. The software of the game generates a corresponding cursor movement on the display screen as long as the contacts are held closed.

Electrical contacts of a joy stick of the type described above are typically defined on a printed circuit board in the base of the joy stick. Malfunctions may occur in any part of the game system; i.e., the computer hardware, software, joy stick cable, or the joy stick itself. In the past, in order to check out the operation of the connecting cable or joy stick, it has been necessary to disassemble the base of the joy stick in order to gain access to the printed circuit board containing the microswitches. Using conventional continuity testers, operating personnel may then check the continuity of each of the switches, and in a similar manner may check the continuity of each lead of a multi-wired cable which forms the joy stick connecting cable. This testing procedure is not only time consuming but it is not completely reliable where the testing personnel is not totally familiar with the layout of the printed circuit board containg the microswitches, since it is necessary to identify which of the microswitches is associated with a particular control direction of the joy stick. In any event, the entire procedure is time consuming since it is necessary to disassemble the base of the joy stick and locate the appropriate leads on the printed circuit board.

Accordingly, it is a primary object of the present invention to provide a device for testing electrical joy stick controllers which obviates each of the deficiencies of the prior art discussed above.

A further object of the invention is to provide a tester as described above which allows testing for continuity and short circuits the microswitches of the joy stick controller without the need for disassembling the base thereof.

Another object of the invention is to provide a tester as described above which provides an indication of the microswitch being tested in terms of correlating the microswitch to the direction of movement of the joy stick.

A still further object of this present invention is to provide a tester as described above which also tests the operation of firing switches and other control functions of a joy stick, or similar controller.

Another object of the invention is to provide a tester as described above which also tests the electrical connecting cable which connects the joy stick controller with the computer.

These, and further objects of the invention will be made clear or will become apparent during the course of the following description of a preferred embodiment of the invention.

BRIEF SUMMARY OF THE INVENTION

According to the present invention, apparatus is provided for detecting short circuits and testing the continuity of a plurality of electrical switches and an associated multi-lead connecting cable of a conventional joy stick controller used for video games and similar computer applications. The apparatus comprises a module provided with a power supply and a connector for receiving a control cable. A plurality of indicating lamps are connected in circuits with the joy stick switches and are spatially arranged on the module to correspond to the position of the joy stick which results in actuation of the associated switch. The lamps indicate the continuity of or a short circuit in the switches as well as the associated leads of the connecting cable. Additional indicating lamps are provided on the module to indicate continuity of other control switches on the controller which are operated independently of the joy stick.

BRIEF DESCRIPTION OF THE DRAWINGS

In the drawings, which form an integral part of the specification are to be read in conjunction therewith, and in which like reference numerals are employed to designate identical components in the various views.

DESCRIPTION OF THE PREFERRED EMBODIMENT

Figure 1:
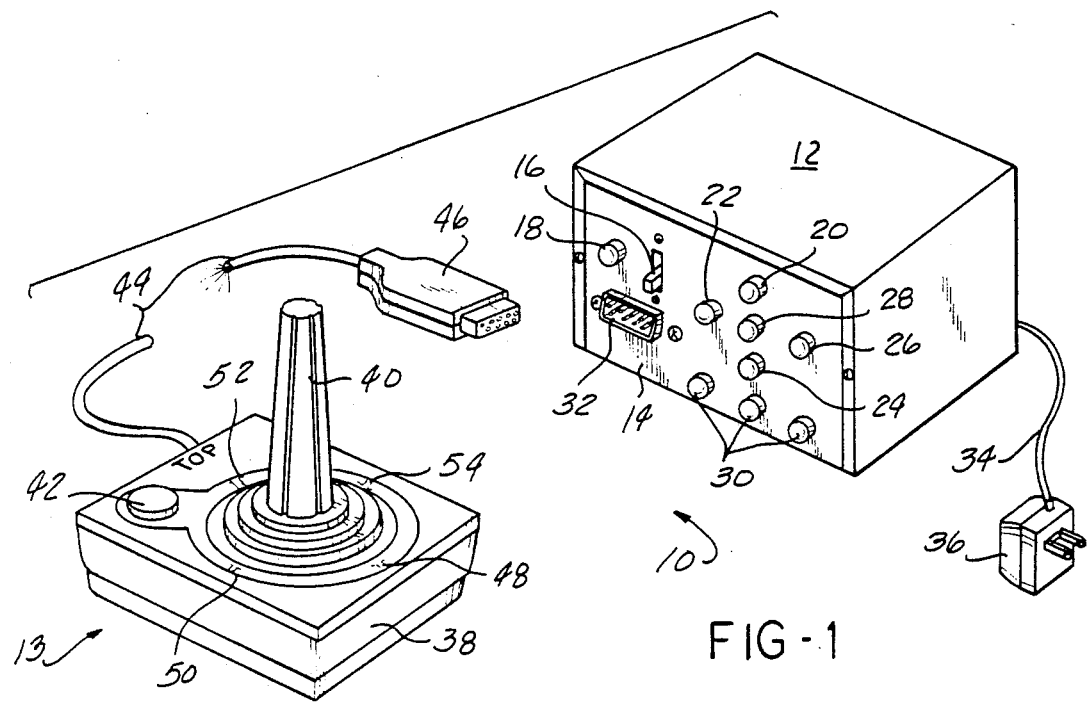
FIG. 1 is a perspective view of the testing apparatus of the present invention shown in combination with a conventional joy stick controller to be tested.

Referring first to FIG. 1, the present invention is concerned with a tester, generally indicated at 10 for testing the continuity of a joy stick type, electrical controller generally indicated by the numeral 13.

Controller 13 includes a base 38 in the nature of a housing, and a manually manipuable upwardly extending joy stick 40. Joy stick 40 is moveable in a orbital manner essentially 360 degrees about a vertical axis. Contained within the base 38 are four micro-switches (not shown) positioned 90 degrees apart at the locations indicated by the numerals 48–54 around the peripher6y of joy stick 40. The joy stick controller 13 is connected to a computer (not shown) by a multi-wire cable which terminates in a male connector 46.

Displacement of the joy stick 40 upwardly toward location 52 results in the closure of the contacts of an associated microswitch, which shorts two of the leads of cable 44, causing the cursor on an associated CRT (not shown) to move upwardly. Similarly, when the joy stick 40 is moved downwardly, or toward position 48, another microswitch is closed, thus shorting a second pair of leads in cable 44 to produce a control signal which moves the cursor downwardly. A similar response is produced when the stick 40 is moved either to position 50 or position 54. Additionally, when the stick 40 is moved diagonally between any two of the adjacent positions 48–54 a pair of the microswitches are activated.

The joy stick controller 13 includes a button 42 associated with still another microswitch (not shown) which closes an additional pair of leads in the cable 44 to produce another control function in the computer, such as the firing of a missile or the like on the CRT.

The testing apparatus 10 broadly includes a housing module 12 having a front panel 14 on which a number of test indicators are mounted. A single pole, single throw switch 16 on panel 14 controls the delivery of power to the testing apparatus 10, and thus functions as an off-on switch. A cable connector 32 is adapted to matingly receive connector 46. Additional connectors similar to connector 32 may be provided in the front panel 14 in order to accommodate the geometric configuration of any of a number of electrical connectors to be used with various types of joy sticks.

An indicator lamp 18 provides an indication of whether the tester 10 is energized as determined by the position of switch 16. Four additional indicator lamps 20–26 are respectively positioned on the top, left, bottom and right side of a central mid-point at which there is located an additional indicator lamp 28. The positions of lamps 20–26 spatially correspond to the positions of the locations of directions 48–54 on the base 38 of joy stick 13. A central indicating lamp 28 is operatively associated with the firing button 42. Additional indicating lamps 30 are provided for auxiliary functions associated with some types of game controllers such as those manufactured by Intellivision and Coleco. Power to the tester 10 is provided via a wall-plug power converter 36 and power cord 34.

Figure 2:
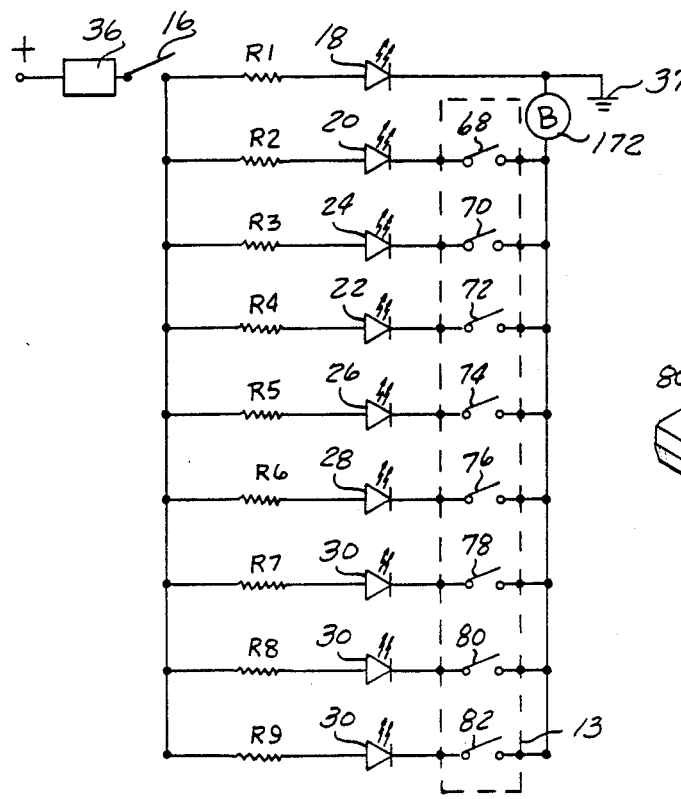
FIG. 2 is a detailed schematic diagram for the circuit of the testing apparatus shown in FIG. 1.

Referring now particularly to FIG. 2, power converter 36 is a conventional device which converts 110 AC to 9 V DC. Indicator lamps 18–30 may comprise conventional light-emitting diodes (LED's). LED's 18–30 are respectively coupled in corresponding series circuits with associated resistors R1–R9 and single throw, single pole switches 16, and 68–82. Switch 68 is contained within base 38 and is adapted to be closed when the stick 40 is moved to position 52. Switch 70 is adapted to be closed when the stick 40 is moved to position 48, corresponding to downward movement of the game cursor, and switches 72 and 74 are also contained within base 38 and are respectively activated when the stick 40 is moved to positions 50 and 54. The above discussed switches 16 and 68–82 and the series circuits in which they are contained are coupled in parallel relationship with each other between the converter 36 and ground 37. Resistors R1–R9 merely function to limit current flowing through LED's 18–30. An electrically actuable audible device, such as buzzer 172 is connected in series with the LED's 20–30 so as to be actuated upon closing of any of the switches 68–82.

In use, in order to test a joy stick or similar controller, connectors 32 and 46 are coupled together and power switch 16 is turned on thus energizing tester 10. Stick 40 is then successively moved to positions 48–54 in order to test the continuity of switches 68–74. When the stick 40 is moved upwardly to position 52, LED 20 will be illuminated if continuity through such switch is achieved. Similarly, LED's 22 and 24 will be respectively illuminated when stick 40 is moved to positions 50 and 54 and LED 24 will be illuminated when switch 40 is moved to position 48. Thus, the operator may tell at a glance which of the switches within base 38, and the corresponding electrical leads in cable 44, is operating properly without the need for disassembling the joy stick 13 or performing tests to determine which of the positions 48–54 corresponds to a particular one of the associated control switches.

In order to test firing switch 76, button 42 is depressed in which case LED 28 will be illuminated if proper continuity through switch 76 is achieved.

Figure 3:
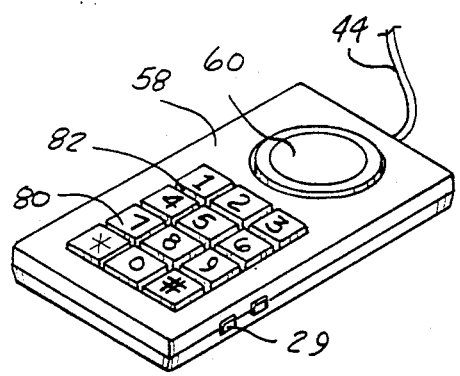
FIG. 3 is a perspective view of an alternate type of controller which may be tested by the apparatus shown in FIG. 1.

Tester 10 is well adapted to test control switches in other types of game controllers which may use a control member other than a stick or the like. For example, as shown in FIG. 3, the tester 10 may be employed to test the continuity of a controller having a rotatable control knob 60 to which there is connected a plurality of internal electrical switches, similar to switches 68–74 which are actuated when knob 60 is turned to a particular rotational position. The controller 58 may be of a hand-held type further provided with a keyboard 80 including a plurality of keys 82 as well as one or more firing buttons 29. Additional controls functions provided by the keys 82 or firebuttons 29 may be connected in circuit via a connecting cable 44 to the tester 10, and more particularly in series circuit with LED's 30, thus allowing testing of these control functions in addition to that of control knob 60.

Figure 4:
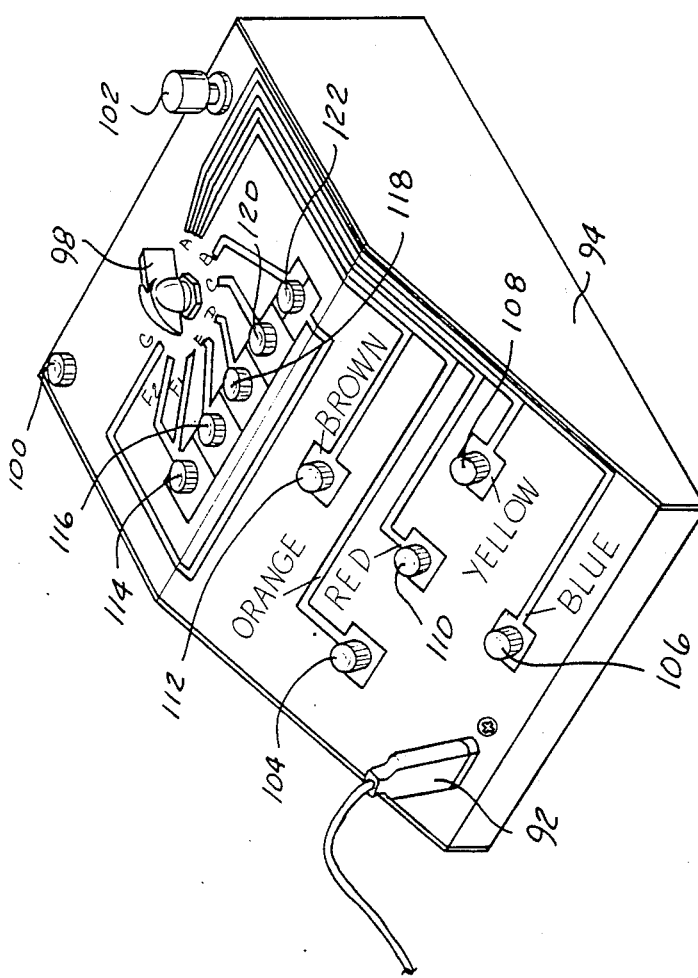
FIG. 4 is a perspective view of an alternate form of the testing apartus of the present invention in combination with another form of joy stick controller.
Figure 5:
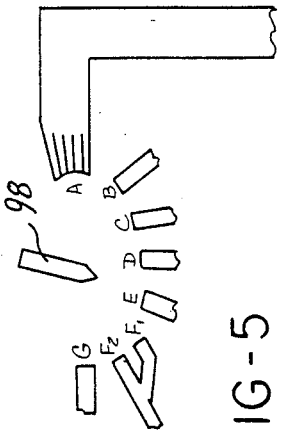
FIG. 5 is an enlarged plan view of the selector switch of the apparatus shown in FIG. 4; and, FIG. 6 is a detailed schematic diagram of the testing circuit which forms a portion of the apparatus of FIG. 4, each of the circuits to be tested being color coded.
Figure 6:
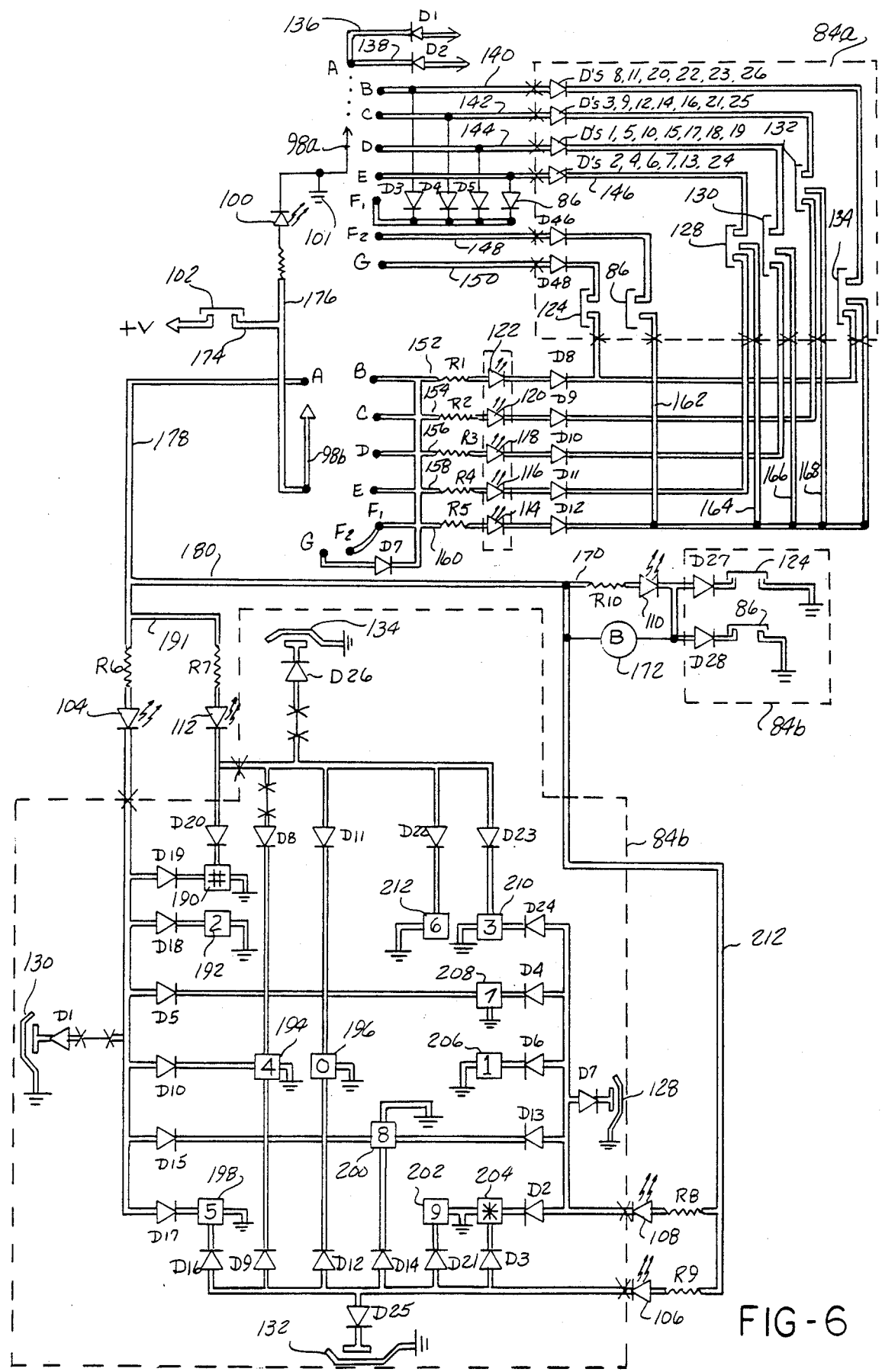

Reference is now made to FIGS. 4–6 wherein another form of the tester 94 of the present invention is depicted. The tester 94 is adapted to test an electrical controller generally indicated at 84 of the type which is presently being manufactured by the Coleco Corporation. The controller 84 includes a joy stick 88 of the type previously described, a pair of firing buttons (left and right) 86,124 and a 12 digit keyboard 96. Each of the keys of keyboard 96 actuates a corresponding microswitch as does switches 86,124. As in the case of the embodiment previously described, the joy stick 88 actuates any of four microswitches depending upon the direction in which the stick 88 is displaced. Each of the microswitches of the controller 84 is coupled through a multi-lead conductor 90 and multi-pin connector 92 to a corresponding connector forming part of the tester 94.

Tester 94 includes an ON/OFF switch 102 which selectively couples power from a DC source (battery) to the testing circuit. An LED 100 coupled through the switch 102 via lines 176 and 174, indicates whether the test circuit is energized. A test selector switch 98 is switchable between any of a plurality of positions A-G (FIG. 5) for selecting different kinds of tests of various portions of the circuits of the controller 84. With the switch 98 at position A, the continuity of all of the circuits in controller 84 are checked for a possible open circuit. However, when switch 98 is in any of the positions B-G, a corresponding portion of a circuit in controller 84 may be checked for a short circuit condition.

As previously suggested, each of the positions B-G respectively correspond to short circuit testing of a portion of the circuit in controller 84. Correlation is achieved between each of the positions B-G and the corresponding circuit by color coding which is indicated both on the face of the tester 94 and on the schematic diagram shown in FIG. 6. A corresponding LED 114-122 is connected in the particular circuit to be tested and is placed within a color coded area on the face of the tester 94. When switch 98 is positioned to any of the positions B-G, a short circuit condition in the controller 84 will result in one of the LED's 114-122 being illuminated the color coding associated with the particular LED 114-122 which is illuminated will identify that portion of the circuit (FIG. 6) in which the short circuit has occurred.

However, with the switch 98 in position A, continuity tests may be performed on the circuits of controller 84. A plurality of LED's 104, 106, 108 and 112 are spatially distributed 90 degrees apart around a central LED 110 on the face of tester 94. When the stick 88 is moved upwardly LED 112 will be illuminated if proper continuity is achieved in the controller circuit which includes the "up" microswitch 134 which is activated by upward movement of stick 88. In a similar manner, LED 104 is actuated when the stick is positioned to the left, thus closing microswitch 130 and LED 108 is illuminated when stick 88 is moved to the right, thereby closing microswitch 128. Finally LED 106 is energized when stick 88 is moved downwardly to actuate microswitch 132. LED 110 is illuminated and a buzzer 172 is sounded when either of the firing switches 86, 124 is actuated during a continuity test.

Referring now more particularly to FIG. 6, the circuits of controller 84 which are to be tested are indicated within the broken lines 84A and 84B, like portions of the circuits being designated by the same color key. The portions of the circuits within the broken line 84A may be tested for short circuits and the portions of circuits indicated within the broken lines 84B may be tested for continuity therein. Thus, some portions of the circuits within 84A, 84B are identical. For example, the "up" microswitch 134 and its corresponding diode D26 lie within broken line 84A and may be tested for a short circuit, and these components are also indicated within the broken line 84B and may be tested for continuity.

Switch 98 includes two switching elements 98A and 98B for respectively making contact with two sets of terminals B-G. With switch elements 98A, 98B in the A position, voltage is impressed across switch 102 and lines 174,176 to terminal A, thence across lines 136 and 138 and corresponding diodes D1, D2 to corresponding color keyed portions of the circuit line within the broken line 84B. In other words with the switch 98 in position A, the controller 84 may be tested for circuit continuity. Line 136 is connected with each of the key switches 190212. Thus, for example, in order to check the continuity of key switch 190, key switch 190 is depressed thus closing a circuit between line 136 and diodes D19 and D20. Current therefore flows from the voltage source through lines 174, 178, 191, LEDs 104, 112 and diodes D19, D20 to the switch 190, thence through diode D1 and line 136 to ground 101.

Depression of switch 192 results in current flow through line 178, LED 104, diode D18, switch 192 and line 136 to ground 101.

Depression of switch 194 results in current flow through lines 178, 180, LEDs 104, 106, 112 and diodes D8, D9 and D10.

Depression of switch 196 results in current flow through lines 178, 191, resistor R7, LED 112, diode D11, lines 180, 212, resistor R9, LED 106 and diode D12.

Depression of switch 200 results in current flow through LEDs 104, 106 and 108 as well as diodes D15, D14 and D13. Actuation of switch 202 results in current flow through resistor R9, LED 106 and diode D21. Depression of switch 204 results in illumination of LED's 106 and 108 as a result of current flow through resistors R8, R9 and diodes D2, D3.

Depression of switch 206 results in current flow through line 212, resistor R8, LED 108 and diode D6. Actuation of switch 208 results in illumination of LEDs 104 and 108 as a result of current flow through lines 178 and 212, resistor R8, diode D4 and diode 5. Actuation of switch 210 results in illumination of LEDs 112 and 108 as a result of current flow through lines 191 and 212, resistor R8, and diodes D23 and D24. Finally, the depression of switch 212 produces illumination of LED112 as a result of current flow through line 191, resistor R7 and diode D22.

It may thus be appreciated that depression of the various key switches of the keyboard 96 results in illumination of one or more of the LEDs 104-112 to verify the continuity of the various circuits containing the microswitches corresponding to the keys.

The continuity of microswitch 130 which is activated by displacing the stick 88 to the left is verified by illumination of LED 104 caused by current flow through resistor R6 and line 178 through diode D1 to ground. The continuity of microswitch 134, which is activated by upward movement of stick 88 is verified as a result of current flow through line 191, resistor R7, LED 112 and diode D26. Continuity of microswitch 128 corresponding to movement of the stick 88 to the right is verified by illumination of LED 108 caused by current flow through line 212, resistor R8 and diode D7. Downward movement of stick 88 closes microswitch 132 which results in illumination of LED 106 due to current flow through line 212, resistor R9 and diode D25.

Finally, the continuity of switches 86 and 124 is verified by the illumination of LED 110 and activation of buzzer 172 as a result of current flow through lines 178, 180, 170, resistor R10 and diodes D27 or D28.

As previously indicated, movement of the selector switch 98 to any of positions B-G results in a test for short circuits in various portions of the circuits of controller 84. With the switch 98 at position B, a circuit path is established as follows: voltage is supplied to switch 102 through switching element 98b, terminal B, line 152, resistor R1, LED 122, diode D8, switch 134, and diodes D8, D11, D20, D22, D23, D26; in the event that any of these lines or components are short circuited to ground, LED 122 will be illuminated to indicate the short circuit condition.

In a similar manner with the switch 98 at position C the following circuit is established and is tested for short circuit condition: from the voltage source to swtich 102 and element 98b, through terminal C, line 154, resistor R2, LED 120, diode D9 switch 132 and diodes D3, D9, D12, D14, D16, D21, D25. With the switch 98 at position D, the following circuit is tested: line 156, resistor R3, LED 118, diode D10, switch 130 and diodes D1, D5, D10, D15, D17, D18 and D19.

Operating the switch 98 to position E results in testing of the following circuit: terminal E, line 158, resistor R4, LED 116, diode D11, switch 128, diodes D2, D4, D6, D7, D13 and D24.

With switch 98 in the $F_1$ position the following circuit is tested: terminal $F_1$, line 160, resistor R5, LED 114, diode D12, switch 86 and diode 46. With switch 98 in the $F_2$ position, the left fire control switch 86 is tested. Finally, with switch 98 at the G position, switch 124 and diode D48 are tested by a circuit containing diode D7, line 152, resistor R1, LED 122 and diode D8.

From the foregoing, it is apparent that the testing apparatus described above not only provides for the reliable accomplishment of the objects of the invention but does so in a particularly effective and economical manner. It is recognized, of course, that those skilled in the art may make various modifications or additions to the preferred embodiment chosen to illustrate the invention without departing from the spirit and scope of the present contribution of the art. Accordingly, it is to be understood that the protection sought and to be afforded hereby should be deemed to extend to the subject matter claimed and all equivalents thereof fairly within the scope of the invention.

I claim:

1. Apparatus for testing an electrical controller of the type including first and second control portions, said first control portion including a control element which is manually shiftable about a central axis between a plurality of positions distributed around said axis, a plurality of electrical switches respectively associated with said positions and each operated by the shifting of said control element to the associated position, said second control portion including at least one electrical switch which is manually operable independent of the shifting of said control element, said electrical controller further including a keyboard having a plurality of key switches, each of said key switches being connected in discrete circuits yielding an output signal equivalent to the output from one to four of said switches respectively associated with said positions around the control element including serially connected diodes, comprising:

a support;
    a plurality of indicator lamps respectively associated with said plurality of electrical switches, said indicator lamps being mounted on said support at positions distributed about a reference point and correlated to the positions of said plurality of switches about said central axis;
    at least one electrically energizable visual indicating element and an audible indicating element mounted on said support and associated with said one switch;
    a source of electrical power;
    first electrical circuit means for coupling said power source with said plurality of switches and said indicator lamps;
    second electrical circuit means for coupling said power source with said one switch and said indicating element;
    third circuit means connecting said indicators and said discrete circuits of the key switches wherein continuity of the discrete circuits may be checked by depressing one of said key switches and comparing the indicators activated with correlated indicators associated with the key switch depressed; and
    fourth circuit means for testing said discrete circuits of the key switches including means for reversing current flow direction for checking said serially connected diodes in said discrete circuits to determine if such diodes prevent current flow in one direction by depressing one of the key switches and comparing the indicators activated with correlated indicators associated with the key switch depressed.

2. The apparatus of claim 1, wherein said first and second electrical circuit means are coupled in parallel relationship to each other.

3. The apparatus of claim 1, wherein said first electrical circuit means includes a plurality of electrical circuits coupled in parallel relationship with each other and respectively associated with said plurality of indicator lamps, each of said circuits connecting said power source, an associated indicator lamp and an associated switch in series relationship with each other whereby closing of the associated switch results in illumination of the corresponding indicator lamp to indicate continuity in said associated switch.

4. The apparatus of claim 1, wherein said visual indicating element is disposed at said reference point.

5. Apparatus for testing the continuity of a portable electrical controller, said controller including a multi-lead cable adapted to be releasably connected with a device to be controlled, a control element manually shiftable around a reference axis between a plurality of positions, and a plurality of electrical switches respectively associated with said positions and each connected to said device through one of said leads, each of said switches being operated by the shifting of said control element to the associated position and each of said switches being actuable in combination with at least one other of said switches positioned adjacent to and disposed around said reference axis, comprising:

a plurality of indicator lamps respectively associated with said switches arranged on a supporting surface and being disposed about a reference point in positions correlated to the position of said switches such that illumination of at least one of said lamps is readily visually associable upon operation of the corresponding actuable switches; and
    circuit means for electrically connecting said indicator lamps with said switches, including an electrical connector for releasably connecting with said cable.

6. The apparatus of claim 5, wherein said circuit means includes a plurality of electrical circuits coupled in parallel relationship with each other and each connecting one of said indicator lamps with one of said leads.

7. Apparatus for electrically testing an electrical controller of the type including a control stick for controlling a first set of functions and which is shiftable between any of four spatially distributed positions and a first set of electrical switches each associated with one of said positions and actuated by the movement of said control stick to the corresponding position, said controller including a second set of electrical switches for controlling a second set of functions, each of said first set of switches being actuable in combination with at least one other of said first set of switches positioned adjacently about said reference axis, comprising:

- a plurality of indicator lamps respectively associated with said first set of switches arranged on a supporting surface and being disposed about a reference point in positions correlated to the position of said first set of switches such that illumination of one or more of said lamps is readily visually associable upon operation of the corresponding one or more of said first set of switches;
- a first test circuit for testing the continuity of said first and second sets of switches;
- a second test circuit for testing said first and second sets of switches for a short circuit condition; and
- means for selecting between said first and second test circuits.

8. The apparatus of claim 7, including means for releasably connecting said first and second test circuits with said first and second sets of switches.

9. The apparatus of claim 7, wherein said selecting means includes a switch for selectively coupling said first and second test circuits with a source of electrical power.

10. The apparatus of claim 7, wherein said first test circuit includes a plurality of continuity circuits respectively connected with said first and second sets of switches, a plurality of indicating means for indicating the continuity in each of said continuity circuits and indicia associating each of said continuity circuits with a corresponding one of said indicating means.

11. The apparatus of claim 7, including a plurality of electrically energizable indicators arranged in spatially distributed positions corresponding to said positions of said stick, said indicators being connected with said first circuit for indicating the continuity of each of said first set of switches.

12. The apparatus of claim 7 for testing an electrical controller further including a keyboard having a plurality of key switches, each of said key switches being connected in discrete circuits yielding an output signal equivalent to the output from one to four of said switches respectively associated with said positions around the control element including serially connected diodes, said apparatus including a third circuit means connecting said indicators and said discrete circuits of the key switches wherein continuity of the discrete circuits may be checked by depressing one of said key switches and comparing the indicators activated with correlated indicators associated with the key switch depressed.

13. The apparatus of claim 12, and a fourth circuit means for testing said discrete circuits of the key switches including means for reversing current flow direction for checking said serially connected diodes in said discrete circuits to determine if such diodes prevent current flow in one direction by depressing one of the key switches and comparing the indicators activated with correlated indicators associated with the key switch depressed.

* * * * *